US007095100B2

(12) United States Patent
Kasuya

(10) Patent No.: US 7,095,100 B2
(45) Date of Patent: Aug. 22, 2006

(54) SEMICONDUCTOR DEVICE AND METHOD OF MAKING THE SAME

(75) Inventor: Yasumasa Kasuya, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 115 days.

(21) Appl. No.: 10/027,856

(22) Filed: Oct. 19, 2001

(65) Prior Publication Data

US 2002/0096790 A1 Jul. 25, 2002

(30) Foreign Application Priority Data

Oct. 23, 2000 (JP) ............................ 2000-322207

(51) Int. Cl.
*H01L 23/02* (2006.01)

(52) U.S. Cl. ...................................................... 257/678

(58) Field of Classification Search ................ 257/678, 257/687, 701

See application file for complete search history.

(56) References Cited

U.S. PATENT DOCUMENTS 5,410,182 A * 4/1995 Kurafuchi et al. .......... 257/692
5,521,429 A * 5/1996 Aono et al. ................. 257/676
5,804,468 A * 9/1998 Tsuji et al. ................. 438/122
5,903,050 A * 5/1999 Thurairajaratnam et al. .......................... 257/695
5,986,333 A * 11/1999 Nakamura .................. 257/667
6,020,218 A * 2/2000 Shim et al. ................. 438/111
6,166,430 A * 12/2000 Yamaguchi ................. 257/666
6,208,023 B1 * 3/2001 Nakayama et al. ......... 257/696
6,211,563 B1 * 4/2001 Tzu ........................... 257/678
6,281,568 B1 * 8/2001 Glenn et al. ................ 257/684
6,294,830 B1 * 9/2001 Fjelstad ...................... 257/724
6,501,156 B1 * 12/2002 Nakanishi et al. .......... 257/666
6,566,168 B1 * 5/2003 Gang ......................... 438/112
2002/0192874 A1 * 12/2002 Schatzler et al. ........... 438/124

* cited by examiner

*Primary Examiner*—Douglas W Owens

(57) ABSTRACT

A semiconductor device and a method of making a semiconductor device are provided, wherein the device includes a die-pad, a semiconductor chip and a sealing resin. The die-pad has a first surface and a second surface opposite to the first surface. The second surface includes an exposed portion and a retreated portion around the exposed portion. The semiconductor chip is mounted on the first surface of the die-pad. The sealing resin covers the die-pad and the semiconductor chip, exposes the exposed portion, and is held in contact with the retreated portion.

10 Claims, 5 Drawing Sheets

1 1a 1b 12 1b 12 11 S1 4 3a 3a 3c 3c 3 3b 5 9a 6b 9 2 2b 6a 2a 9 6b 6a 9a 5 3b 3

15
16
17
18
9
3
2

SEMICONDUCTOR DEVICE AND METHOD OF MAKING THE SAME

BACKGROUND OF THE INVENTION

1. Field of the Invention:

The present invention relates to a semiconductor device of the Quad Flat Non-leaded (QFN) package type, and a method of making the same.

2. Description of the Related Art:

FIG. 6 is a plan view showing a prior art semiconductor device S3 of the Quad Flat Non-leaded (QFN) package type. FIG. 7 is a sectional view taken along lines VII—VII of FIG. 6. The semiconductor device S3 includes a semiconductor chip 31, a die-pad 32 on which the semiconductor chip 31 is mounted, a plurality of leads 33, and a sealing resin 34 which is illustrated as transparent in FIG. 6. The semiconductor chip 31 is electrically connected to the die-pad 32 via a first wire 41 for grounding. Each of the leads 33 is electrically connected to the semiconductor chip 31 via a second wire 42. The sealing resin 34 seals the semiconductor chip 31, the first wire 41 and the second wires 42 while exposing the lower surface 32*b* of the die-pad 32 and part of each lead 33.

In the semiconductor device S3, the lower surface 32*b* of the die-pad 32 is exposed to the outside. Therefore, as indicated by the arrow A in FIG. 8, water is likely to enter through the boundary between the die-pad 32 and the sealing resin 34 and may reach the upper surface 32*a* of the die-pad 32. In the reflowing process for mounting the semiconductor device S3 onto a mother board (not shown), when the die-pad 32 is heated while containing water on the upper surface 32*a*, the sealing resin 34 is removed from the die-pad 32 to shrink in the arrow B direction. As a result, the sealing resin 34 exerts a stress to the first wire 41, which may lead to the breakage of the first wire 41.

SUMMARY OF THE INVENTION

It is therefore an object of the present invention to provide a semiconductor device having a high reliability by preventing the removal of a sealing resin due to water infiltration.

According to a first aspect of the present invention, a semiconductor device is provided. The semiconductor device comprises; a die-pad having a first surface and a second surface opposite to the first surface, the second surface including an exposed portion and a retreated portion around the exposed portion; a semiconductor chip mounted on the first surface of the die-pad; a sealing resin for covering the die-pad and the semiconductor chip, wherein the resin is held in contact with the retreated portion while exposing the exposed portion.

Preferably, the retreated portion comprises a retreated surface and a side surface which adjoins the exposed portion, and the retreated surface forms an acute angle together with the retreated surface.

Preferably, the die-pad includes a slit opening at the retreated surface of the second surface and at the first surface.

Preferably, the die-pad includes a plurality of slits opening at the retreated surface of the second surface and at the first surface, and the plurality of slits are arranged to surround the semiconductor chip.

Preferably, the semiconductor chip is electrically connected to the die-pad via a first wire, and the first wire is connected to the first surface of the die-pad at a portion between a peripheral edge of the die-pad and the slit.

Preferably, the semiconductor device further comprises a terminal electrically connected to the semiconductor chip via a second wire. The terminal is retained by the sealing resin so as to expose a part thereof.

According to a second aspect of the present invention, another semiconductor device is provided. The semiconductor device comprises; a semiconductor chip; a die-pad which has an upper surface on which the semiconductor chip is mounted and a lower surface opposite to the first surface, the die-pad being electrically connected to the semiconductor chip via a first wire; and a plurality of leads electrically connected to the semiconductor chip via second wires, the semiconductor chip being sealed with a sealing resin with the lower surface of the die-pad exposed. The die-pad includes a thin-walled portion formed by removing the lower surface along a peripheral edge of the die-pad and also includes at least one slit penetrating through the thin-walled portion.

Preferably, the sealing resin extends under the thin-walled portion so as not to expose an opening of the slit.

Preferably, the slit is provided along a side surface of the semiconductor chip so as to surround the semiconductor chip.

Preferably, the first wire is connected at one end thereof to the semiconductor chip and connected at the other end thereof to the die-pad at a portion between a peripheral edge and the slit.

According to a third aspect of the present invention, a semiconductor device making method comprises the steps of; punching a conductive frame to form a die-pad having an upper surface and a lower surface opposite to the upper surface, and to form a slit penetrating through the die-pad adjacent the peripheral edge of the die-pad; performing etching with respect to the lower surface along the peripheral edge of the die-pad to form a thin-walled portion in the die-pad so that the slit opens at the thin-walled portion; mounting a semiconductor chip on the upper surface of the die-pad; bonding the semiconductor chip and the die-pad via a wire; and sealing the semiconductor chip with a sealing resin so that the lower surface of the die-pad is exposed.

Other features and advantages of the present invention will become clearer from the detailed description given below with reference to the accompanying drawings.

BEST MODE FOR CARRYING OUT THE INVENTION

Preferred embodiments of the present invention will be described below in detail with reference to FIGS. 1–5.

Figure 1:
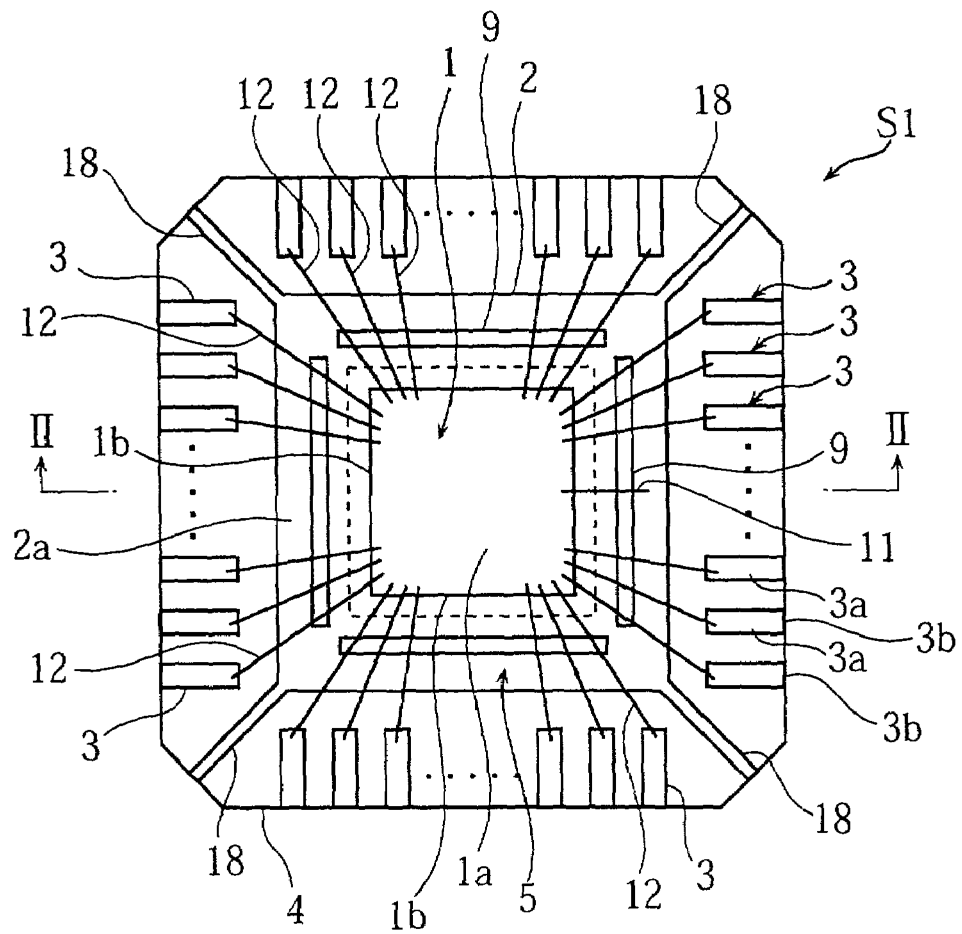
FIG. 1 is a plan view showing a semiconductor device according to a first embodiment of the present invention.
Figure 2:
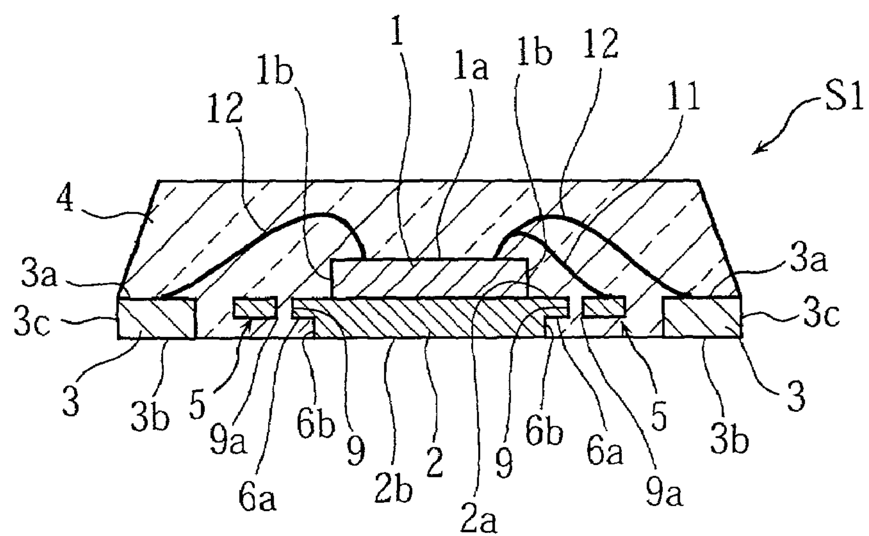
FIG. 2 is a sectional view taken along lines II—II of FIG. 1.

FIG. 1 is a plan view showing a semiconductor device S1 according to a first embodiment of the present invention. FIG. 2 is a sectional view taken along lines II—II of FIG. 1. The semiconductor device S1 includes a semiconductor chip 1 having an upper surface 1*a* and side surfaces 1*b*, a die-pad 2 having an upper surface 2*a* and a lower surface 2*b*, a plurality of leads 3 for connection to external terminals, a sealing resin 4 which is illustrated as transparent in FIG. 1, a first wire 11 for grounding, and a plurality of second wires 12.

The semiconductor chip 1, which maybe an LSI chip or another kind of IC chip for example, is a silicon chip having one surface on which desired integrated electronic circuit is formed. The upper surface 1*a* of the semiconductor chip 1 is provided with a plurality of electrode pads (not shown). For obtaining good conductivity, the electrode pads may be formed by gold-plating electrodes of aluminum formed on the upper surface 1*a* of the semiconductor chip 1.

The first wire 11, which may be formed of gold for example, is bonded, at one end thereof, to the electrode pad for ground connection of the semiconductor chip 1. The other end of the first wire 11 is connected to the upper surface 2*a* of the die-pad 2. Generally, when the semiconductor device S1 is surface-mounted onto a mother board (not shown), the lower surface 2*b* of the die-pad 2 is connected to a ground pattern formed on the mother board. In this way, the grounding of the semiconductor chip 1 is realized via the first wire 11.

Each of the second wires 12, which may be formed of gold for example, is bonded, at one end thereof, to a respective one of other electrode pads on the semiconductor chip 1. The other end of the second wire 12 is connected to the upper surface 3*a* of a corresponding one of the leads 3 arranged around the semiconductor chip 1.

The die-pad 2 is a thin metal plate of a predetermined thickness formed of copper for example and larger than the semiconductor chip 1. The semiconductor chip 1 is bonded, via an adhesive, to a central portion on the upper surface 2*a* of the die-pad 2. The die-pad 2 includes a thin-walled portion 5 formed by cutting away peripheral portions of the lower surface 2*b*.

The thin-walled portion 5 has a thickness which is about one half of that of other portions of the die-pad 2. On the lower surface side 2*b* of the die-pad 2, the thin-walled portion 5 is defined by a retreated surface 6*a* and a side surface 6*b*. In this embodiment, the side surface 6*b* extends generally perpendicularly to the retreated surface 6*a*. The thin-walled portion 5 is formed with a plurality of thickness wise penetrating slits 9 arranged to surround the semiconductor chip 1. As clearly shown in FIG. 1, each of the slits 9 extends along a respective side surface 1*b* of the semiconductor chip 1. One end of the first wire 11 is connected to the electrode pad provided on the upper surface 1*a* of the semiconductor chip 1 as described before, whereas the other end of the first wire is connected onto the die-pad 2 at a portion between the slit 9 and a peripheral edge of the die-pad 2. Thus, the first wire 11 bridges the slit 9.

Similarly to the die-pad 2, the leads 3 are formed from a thin metal plate of copper for example. The leads 3 are spaced from each other along the side surfaces 1*b* of the semiconductor chip 1.

The sealing resin 4 may be formed of a thermosetting resin such as an epoxy resin. As clearly shown in FIG. 2, the sealing resin 4 seals or covers the semiconductor chip 1, the first wire 11, the second wires 12, the upper surface of the die-pad 2 and the leads 3, while exposing part of the lower surface 2*b* of the die-pad 2, the lower surfaces 3*b* and the side surfaces 3*c* of the leads 3 to the outside. Since the sealing resin 4 encloses the thin-walled portion 5 of the die-pad 2, the openings 9*a* of the slits 9 formed in the thin-walled portion 5 are not exposed to the outside.

To surface-mount the semiconductor device S1 onto a substrate (not shown), solder paste is applied to the wiring pattern formed on the substrate. Then, the device S1 is placed on the substrate so that the lower surface 2*b* of the die-pad 2 and the lower surfaces 3*b* of the respective leads 3 come into contact with the solder-applied wiring pattern. Precisely, the lower surface 2*b* of the die-pad 2 is brought into contact with the grounding portion of the wiring pattern. After the device S1 is properly positioned on the substrate, the applied solder paste is heated up so as to perform reflow soldering. As a result, the device S1 is electrically connected to the substrate via the die-pad 2 and the leads 3.

According to the semiconductor device S1 having the above structure, water infiltration to the upper surface 2*a* of the die-pad 2 can be prevented or lessened. In the semiconductor device S1, since the die-pad 2 and the sealing resin 4 have a boundary exposed to the outside, water may enter through the gap between the side surface 6*b* and the sealing resin 4. However, owing to the retreated surface 6*a* extending perpendicularly to the side surface 6*b*, the progress of water can be terminated. Thus, water is unable to reach or less likely to reach the upper surface 2*a* of the die-pad 2, whereby the removal of the sealing resin 4 in the reflowing process is reliably prevented. Consequently, it is possible to provide a reliable semiconductor device in which the breakage of the first wire 11 due to the removal of the sealing resin 4 does not occur.

In the semiconductor device S1, the sealing resin 4 surrounds the thin-walled portion 5 and fills the slits 9 provided at the thin-walled portion 5. This provides an 'anchoring effect' contributing to secure bonding between the die-pad 2 and the sealing resin 4. Thus, the die-pad 2 and the sealing resin 4 are irremovably attached to each other. Since the sealing resin 4, extending around and under the thin-walled portion 5, fills the openings 9*a* of the slits 9, water filtration through the slits 9 can be completely prevented or significantly lessened.

Further, in the semiconductor device S1, part of the sealing resin 4 extends into the plurality of slits 9 formed in the die-pad 2 for engagement therewith. Therefore, even if water reaches the upper surface 2*a* of the die-pad 2, thereby causing the sealing resin 4 to come off the surface at a location adjacent to the semiconductor chip 1, the slits 9 around the semiconductor chip 1 prevent the resin removal from propagating toward the peripheral edges of the die-pad 2 beyond the slits. Since the first wire 11 is connected at one end to the semiconductor chip 1 and at the other end to a portion of the die-pad 2 that is located between the slit 9 and the peripheral edge of the die-pad 2, the removal of the sealing resin does not affect the first wire 11. Therefore, the bonding condition of the first wire 11 to the die-pad 2 is kept good.

For preventing the removal of the resin seal 4, each of the slits 9 may be formed in the die-pad 2 at a portion inward from the thin-walled portion 5. In such a case, however, the opening 9*a* of the slit 9 is exposed to the outside, which increases the possibility that water advances along the inner surfaces of the slit 9 to reach the upper surface 2*a* of the die-pad 2. Therefore, in view of the prevention of water infiltration, it is preferable that the slit 9 is so formed as to penetrate through the thin-walled portion 5. Instead of the slit 9, the upper surface of the die-pad 2 may be formed with a recess for engagement with the sealing resin 4. In this case, since the recess is not open at the lower surface 2*b* of the die-pad 2, water filtration can be prevented even when the recess is provided inward from the thin-walled portion 5 in the die-pad 2.

Figure 3:
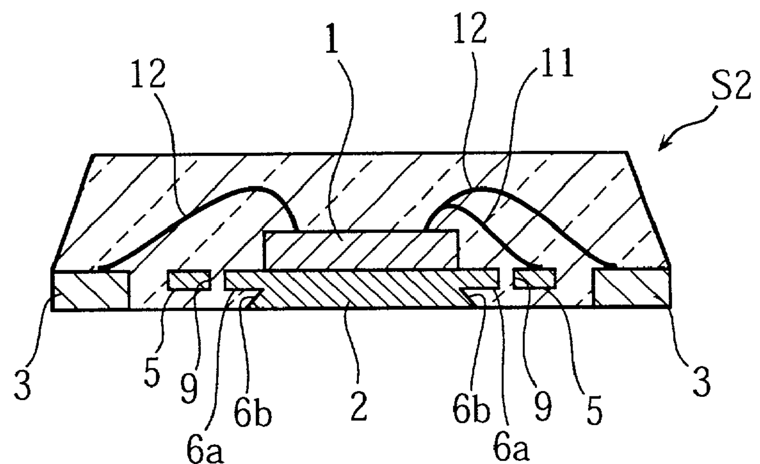
FIG. 3 is a sectional view showing a semiconductor device according to a second embodiment of the present invention.

FIG. 3 is a sectional view showing a semiconductor device S2 according to a second embodiment of the present invention. The semiconductor device S2 differs from the semiconductor device S1 in configuration of side surface 6*b*. In the second embodiment, the side surface 6*b* extends toward the center of the semiconductor chip 1 as it approaches the retreated surface 6*a*. That is, the side surface 6*b* together with the retreated surface 6*a* forms an acute angle. Other portions are configured in a way similar to those of the above-described semiconductor device S1.

In the semiconductor device S2, the sealing resin 4 comes into more secure contact with the die-pad 2, so that the die-pad 2 and the sealing resin 4 are held together more stably. However, the configuration of the side surface 6*b* is not limited to those described above, and another configuration may be employed as long as it ensures close contact between the die-pad 2 and the sealing resin 4.

Figure 5:
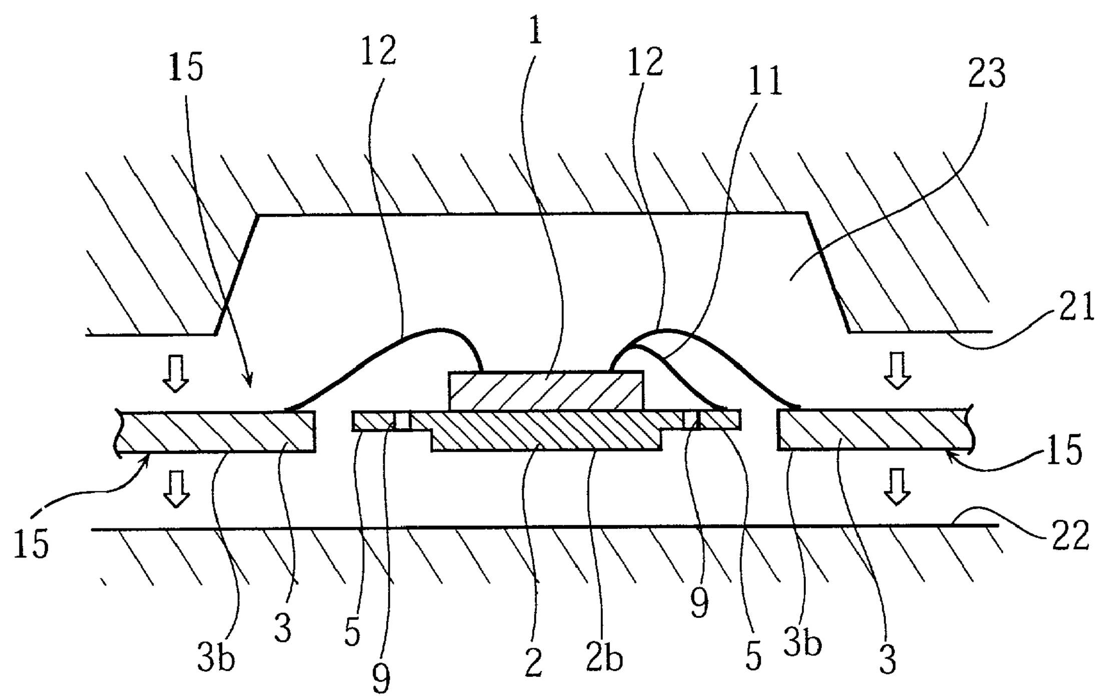
FIG. 5 illustrates a method of making a semiconductor device according to the present invention.
Figure 4:
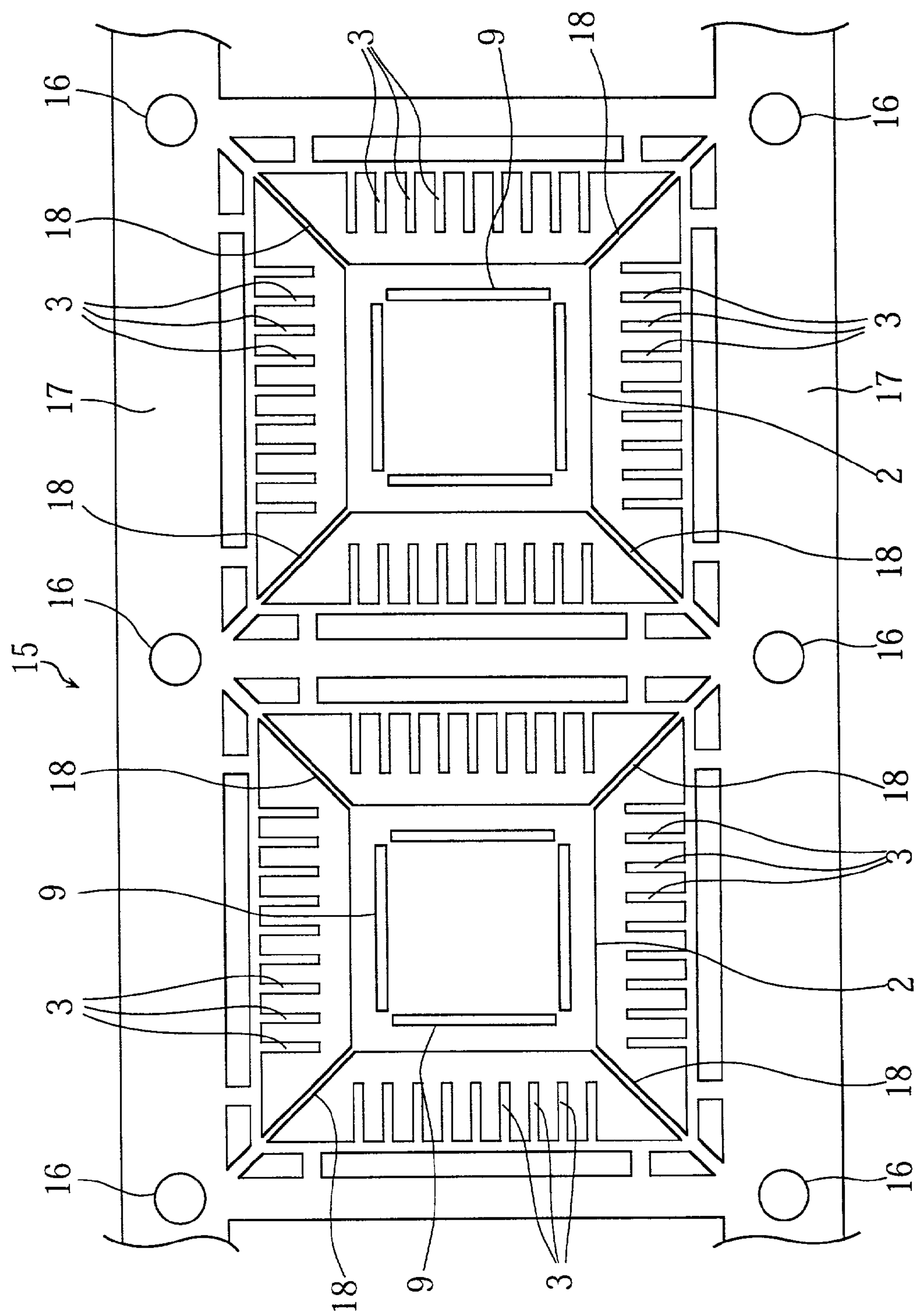
FIG. 4 illustrates a method of making a semiconductor device according to the present invention.
Figure 6:
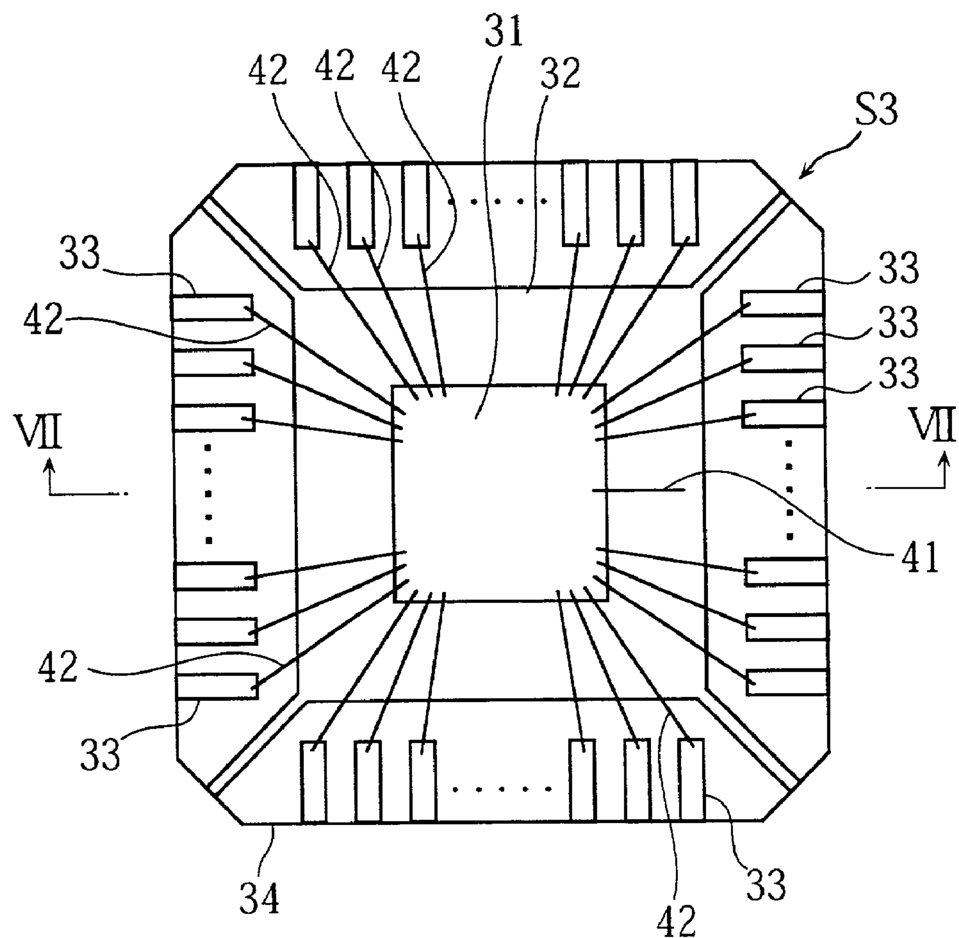
FIG. 6 is a plan view showing a prior art semiconductor device.
Figure 7:
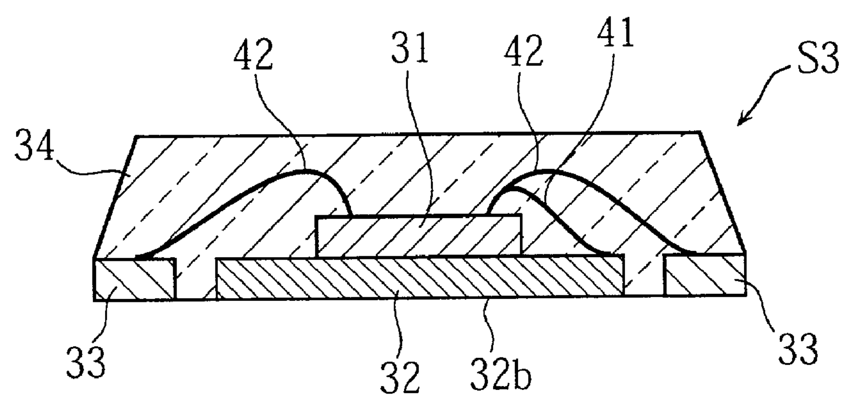
FIG. 7 is a sectional view taken along lines VII—VII of FIG. 6.
Figure 8:
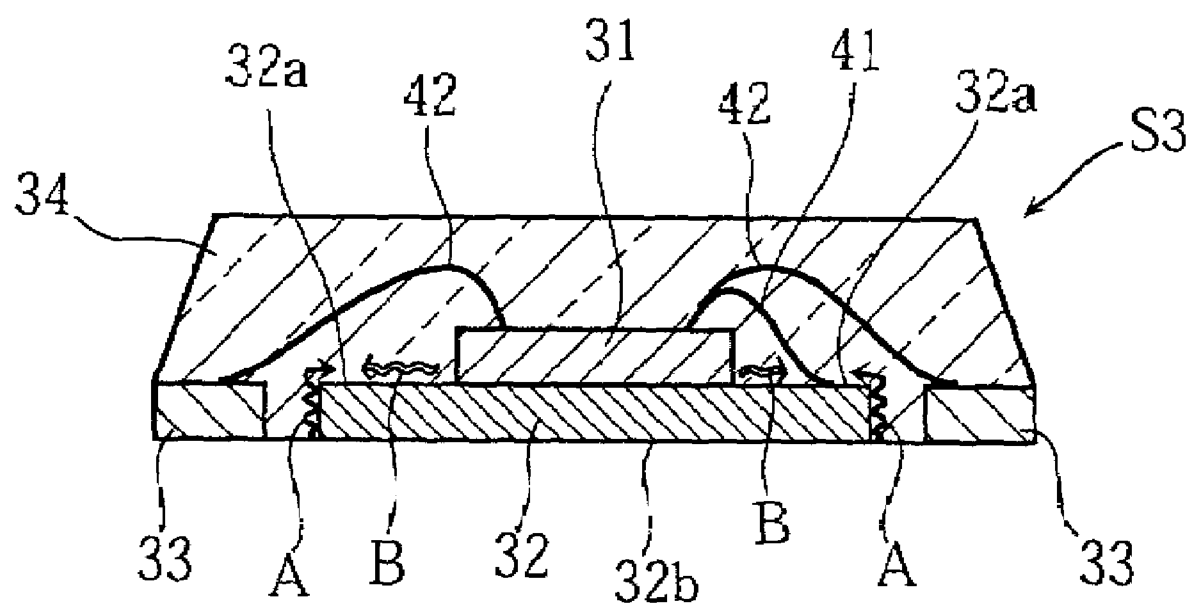
FIG. 8 illustrates how the removal of the sealing resin occurs.

Referring now to FIGS. 4 and 5, a semiconductor device fabrication method of the present invention will be described below. First, an elongated conductive frame 15 is prepared. Then, as shown in FIG. 4, punching and pressing is performed with respect to the conductive frame 15. Specifically, the punching and pressing with respect to the conductive frame 15 is performed to provide two support bars 17 each formed with a plurality of perforations 16 arranged at a predetermined pitch, and to provide a plurality of die-pads 2 between the support bars at a predetermined pitch longitudinally of the conductive frame 15. At this time, with respect to each of the die-pads 2, connection leads 18 for supporting the die-pad 2 are formed at the respective corners of the pad. Further, a plurality of slits 9 are formed adjacent to the peripheral edges of the die-pad 2. A plurality of leads 3 are formed around the die-pad 2.

Subsequently, with respect to each of the die-pads 2, portions of the lower surface 2*b* adjacent the peripheral edges thereof are removed by etching so that a thin-walled portion 5 is provided. The portions etched include portions in which the slits 9 are formed. At this time, the portions adjacent the peripheral edges of the die-pad 2 may be etched by e.g. wet etching to a thickness which is about one half of that of other portions. Alternatively, the thin-walled portion 5 may be formed by a punching process together with other portions if these other portions have a sufficiently large thickness. The configuration of the frame 15 shown in FIG. 4 may be provided by an etching process.

Next, a semiconductor chip 1 is mounted by die-bonding to the center of the upper surface 2*a* of each die-pad 2. Then, a first wire 11 is bonded to the electrode pad for grounding of the semiconductor chip 1 and the upper surface 2*a* of the die-pad 2. With respect to the die-pad 2, the first wire 11 is bonded at a portion between the slit 9 and the peripheral edge of the die-pad 2. Then, a second wire 12 is bonded to connect each of other electrode pads of the semiconductor chip 1 to a corresponding one of the leads 3.

Then, as shown in FIG. 5, the frame 15 is interposed between an upper mold member 21 and a lower mold member 22. At this time, the lower surface 2*b* of each die-pad 2 (except for the thin-walled portion 5) and the lower surfaces 3*b* of the respective leads 3 are brought into contact with the lower mold member 22. Then, a packaging resin such as an epoxy resin in a molten state is supplied to fill the cavity defined by the upper mold member 21 and the lower mold member 22. This resin is then solidified. At this time, no clearance is formed between the lower surfaces 3*b* of the leads 3 and the lower mold member 22, and between the lower surface 2*b* of the die-pad 2 (except for the thin-walled portion 5) and the lower mold member 22. Therefore, the lower surfaces 3*b* and the lower surface 2*b* (except for the thin-walled portion 5) are not covered with the resin. After the resin is solidified, the resin-packaged semiconductor device S1 is removed from the upper and the lower mold members 21, 22. Then, unnecessary portions of the leads 3 are cut away. As a result, the resin-packaged semiconductor device S1 is obtained.

The semiconductor device S2 can also be formed by the above-described fabrication method. In forming the thin-walled portion 5 of the semiconductor device S2, the side surface 6*b*, which forms an acute angle together with the retreated surface 6*a*, may be formed by performing over-etching.

The scope of the present invention is not limited to the above-described embodiments. For example, the structure of the semiconductor chip 1, and the material, configuration, size of the die-pad 2 are not limited to the above-described embodiments.

The invention claimed is:

1. A semiconductor device comprising:

a die-pad including a first surface, a second surface opposite to the first surface, and a peripheral edge, the second surface including an exposed portion and a retreated portion around the exposed portion;

a semiconductor chip mounted on the first surface of the die-pad; and a sealing resin covering the die-pad and the semiconductor chip, the resin allowing the exposed portion to be exposed and being held in contact with the retreated portion, wherein the die-pad is formed with at least one slit that is open in the retreated portion of the second surface and in the first surface, the at least one slit is located between the peripheral edge of the die-pad and the semiconductor chip, the semiconductor chip has a side facing the at least one slit and extending from a first corner of the chip to a second corner of the chip, and the at least one slit is formed along the side of the chip and extends continuously from a first position that is closer to the first corner of the chip than to the second corner of the chip to a second position that is closer to the second corner of the chip than to the first corner of the chip.

2. The semiconductor device according to claim 1, wherein the retreated portion is defined by a retreated surface and a side surface which adjoins the exposed portion and forms an acute angle together with the retreated surface.

3. The semiconductor device according to claim 1, wherein the die-pad is formed with a plurality of slits that are opened in the retreated surface of the second surface and in the first surface, the plurality of slits being arranged to surround the semiconductor chip.

4. The semiconductor device according to claim 1, wherein the semiconductor chip is electrically connected to the die-pad via a first wire, the first wire being connected to the first surface of the die-pad at a portion between a peripheral edge of the die-pad and the at least one slit.

5. The semiconductor device according to claim 1, further comprising a terminal electrically connected to the semiconductor chip via a second wire, the terminal being retained by the sealing resin so as to be partially exposed.

6. A semiconductor device comprising:

a semiconductor chip;

a die-pad including an upper surface on which the semiconductor chip is mounted and a lower surface opposite to the first surface, the die-pad being electrically connected to the semiconductor chip via a first wire;

a plurality of leads spaced from the die-pad via a clearance and electrically connected to the semiconductor chip via second wires; and a sealing resin enclosing the semiconductor chip in a manner such that the lower surface of the die-pad is exposed;

wherein the die-pad includes a thin-walled portion formed by removing a part of the lower surface along a peripheral edge of the die-pad, the die-pad being formed with at least one slit extending through the thin-walled portion, the at least one slit is located inwardly from the clearance and between the peripheral edge of the die-pad and the semiconductor chip, the semiconductor chip has a side facing the at least one slit and extends from a first corner of the chip to a second corner of the chip, and the at least one slit is formed along the side of the chip and extends continuously from a first position that is closer to the first corner of the chip than to the second corner of the chip.

7. The semiconductor device according to claim 6, wherein the sealing resin extends under the thin-walled portion so as not to expose an opening of the slit.

8. The semiconductor device according to claim 7, wherein the at least one slit extends along a side surface of the semiconductor chip around the semiconductor chip.

9. The semiconductor device according to claim 7, wherein the first wire is connected at one end thereof to the semiconductor chip and connected at another end thereof to the die-pad at a portion between a peripheral edge of the die-pad and the at least one slit.

10. A semiconductor device comprising:

a die-pad including a first surface, a second surface opposite to the first surface, and a peripheral edge, the second surface including an exposed portion and a retreated portion around the exposed portion;

a semiconductor chip mounted on the first surface of the die-pad, the chip having a first side and a second side adjoining the first side to define a corner between the first and second sides; and a sealing resin covering the die-pad and the semiconductor chip, the resin allowing the exposed portion to be exposed and being held in contact with the retreated portion, wherein the die-pad is formed with first and second slits each of which is open in the retreated surface of the second surface and in the first surface, the slits are being located between the peripheral edge of the die-pad and the semiconductor chip, the first slit facing and extending along the first side of the semiconductor chip, the second slit facing and extending along the second side of the semiconductor chip, and wherein the first and second slits are discontinuous with each other at the corner of the chip.

* * * * *